(12) United States Patent
Risaki

(10) Patent No.: US 10,438,944 B2
(45) Date of Patent: Oct. 8, 2019

(54) SEMICONDUCTOR DEVICE HAVING ESD ELEMENT

(71) Applicant: SII Semiconductor Corporation, Chiba-shi, Chiba (JP)

(72) Inventor: Tomomitsu Risaki, Chiba (JP)

(73) Assignee: ABLIC Inc. (JP)

( * ) Notice: Subject to any disclaimer, the term of this patent is extended or adjusted under 35 U.S.C. 154(b) by 0 days.

(21) Appl. No.: 15/328,724

(22) PCT Filed: Jul. 8, 2015

(86) PCT No.: PCT/JP2015/069643
§ 371 (c)(1),
(2) Date: Jan. 24, 2017

(87) PCT Pub. No.: WO2016/017383
PCT Pub. Date: Feb. 4, 2016

(65) Prior Publication Data
US 2017/0221878 A1    Aug. 3, 2017

(30) Foreign Application Priority Data

Jul. 31, 2014  (JP) ................................. 2014-156501
Jun. 4, 2015   (JP) ................................. 2015-114024

(51) Int. Cl.
*H01L 27/02*   (2006.01)
*H01L 27/088*  (2006.01)
(Continued)

(52) U.S. Cl.
CPC ...... *H01L 27/0274* (2013.01); *H01L 23/4824* (2013.01); *H01L 23/528* (2013.01);
(Continued)

(58) Field of Classification Search
CPC ............ H01L 29/0821; H01L 27/0274; H01L 23/4824; H01L 23/528; H01L 27/088
See application file for complete search history.

(56) References Cited

U.S. PATENT DOCUMENTS 6,424,013 B1 * 7/2002 Steinhoff ............ H01L 27/0277
257/355
7,187,527 B2 * 3/2007 Su ........................ H01L 27/0251
361/56
(Continued)

OTHER PUBLICATIONS

Abstract, Publication No. JP 09-181195, Publication Date Jul. 11, 1997.
(Continued)

*Primary Examiner* — Latanya N Crawford
(74) *Attorney, Agent, or Firm* — Adams & Wilks

(57) ABSTRACT

When an ESD element is operated, for the purpose of suppressing heat generation and causing uniform current to flow through all channels of all transistors included in the ESD element, various substrate potentials existing in the transistors and the channels of a multi finger type ESD element are electrically connected via a low resistance substrate, and further, are set to a potential that is different from a Vss potential. In this manner, the current is uniformized and heat generation is suppressed through low voltage operation to improve an ESD tolerance.

4 Claims, 13 Drawing Sheets

(51) Int. Cl.
      *H01L 23/528*     (2006.01)
      *H01L 23/482*     (2006.01)

(52) U.S. Cl.
      CPC ...... *H01L 27/0207* (2013.01); *H01L 27/0277* (2013.01); *H01L 27/088* (2013.01)

(56) References Cited

U.S. PATENT DOCUMENTS

| | | | |
|---|---|---|---|
| 7,394,630 B2* | 7/2008 | Ker | H01L 27/0266 361/111 |
| 7,705,404 B2* | 4/2010 | Ker | H01L 27/027 257/538 |
| 8,692,330 B2* | 4/2014 | Otsuru | H01L 27/0277 257/355 |
| 9,673,187 B2* | 6/2017 | Salcedo | H01L 27/0259 |
| 2007/0246738 A1* | 10/2007 | Otake | H01L 29/0626 257/139 |
| 2008/0042206 A1* | 2/2008 | Kim | H01L 27/0251 257/355 |
| 2016/0300830 A1* | 10/2016 | Salcedo | H01L 27/0259 |

OTHER PUBLICATIONS

International Search Report dated Sep. 29, 2015 in International Application No. PCT/JP2015/069643 together with English-language translation thereof.

\* cited by examiner

SEMICONDUCTOR DEVICE HAVING ESD ELEMENT

TECHNICAL FIELD

The present invention relates to a semiconductor device having an ESD element constructed from a transistor.

BACKGROUND ART

An ESD element is essential in terms of reliability though it is irrelevant to a function of an IC. The ESD element is an electrostatic discharge element configured to discharge static electricity such that the IC does not break down by the static electricity.

Accordingly it is essential that the ESD element itself does not thermally break down by static electricity and protects the internal circuit by drawing charges promptly before static electricity enters an internal circuit. In order to satisfy those conditions, suppression of local heat generation and high driving capability are required to ESD element characteristics.

NMOS transistors as illustrated in FIG. 8A to FIG. 8C are a typical ESD protection circuit. FIG. 8A is a plan view, FIG. 8B is a sectional view taken along the line A-A', and FIG. 8C is an equivalent circuit. Gate electrodes 1 to 6 and N+ sources 11 of the NMOS transistors are connected, via wiring 17, to a Vss terminal having a lower power supply potential, and N+ drains 12 of the NMOS transistors are connected to a pad via wiring 18. The NMOS transistors are in a P-well 14. The P-well 14 has P+ regions 13 for fixing a P-well potential for the purpose of fixing the potential, and is connected to the wiring 17 having a Vss potential via a contact 16. The expression of N+ or P+ implies, in addition to a conductivity type of a semiconductor, that an impurity concentration of a region indicated with N+ or P+ is higher than that of a region indicated with N or P and is a concentration with which an ohmic contact with metal wiring can be generally formed. A "heavily doped N-type drain" has the same meaning as an "N+ drain".

Static electricity injected into the pad causes a breakdown in the N+ drains 12 to generate positive holes. The positive holes raises the potential of the P-well 14 to induce parasitic bipolar action of the NMOS transistors to dissipate static electricity from the N+ drains 12 to the N+ sources 11. Thus, such NMOS transistors are known to have an ESD tolerance that is higher than that of a diode ESD element.

Meanwhile, there is a problem specific to this structure. As disclosed in Patent Literature 1, the P-well 14 is of a high resistance, and thus, positive holes accumulate in the P-well 14 in the vicinity of a transistor away from the P+ regions 13 for fixing a P-well potential for the purpose of fixing the potential of the P-well 14, and parasitic bipolar action is liable to occur. There arises a problem in that current concentrates on a transistor away from the P+ region 13 for fixing a P-well potential, and an ESD tolerance cannot be obtained as intended.

As can be seen from FIG. 8B, transistors having the gate electrodes 3 and 4 are farthest from the P+ regions 13 for fixing the P-well potential, transistors having the gate electrodes 1 and 6 are closest thereto, and transistors having the gate electrodes 2 and 5 are at an intermediate distance. A LOCOS oxide film 10 for separation exists between a transistor on each side and the P+ region 13 for fixing the well potential, and a gate insulating film 15 is arranged under each gate electrode. Further, as illustrated in FIG. 8C, P-well parasitic resistances Rpw1, Rpw2, and Rpw3 exist between Vss and a P0 well 14 immediately below the transistors having the gate electrodes 1 and 6, the transistors having the gate electrodes 2 and 5, and the transistors having the gate electrodes 3 and 4, respectively. The parasitic resistances correspond to distances from the respective transistors to the P+ regions 13 for fixing a P-well potential, and thus, the following relationship holds.

$$Rpw1 < Rpw2 < Rpw3$$

Accordingly it is the transistors having the gate electrodes 3 and 4 with the parasitic resistances Rpw3 that are most liable to cause a parasitic bipolar action. Current-voltage characteristics of the transistors are thus shown by I-V characteristics 52 in FIG. 8D and current concentration occurs. The transistors having the gate electrodes 2 and 5 and the transistors having the gate electrodes 1 and 6 show I-V characteristics 51 and 50 respectively.

A solution has been shown in an invention disclosed in Patent Literature 1. FIG. 9A to FIG. 9C are conceptual illustrations of the invention. FIG. 9A is a plan view, FIG. 9B is a sectional view taken along the line B-B', and FIG. 9C is an equivalent circuit. Further, with reference to FIG. 9A, a pad electrode 18 is assumed to be not floating, but connected to a pad via an upper layer electrode.

When FIG. 8A to FIG. 8C and FIG. 9A to FIG. 9C are compared, in FIG. 9A to FIG. 9C, the gate electrodes 1 to 6 are not directly connected to a Vss electrode 17 to which first P+ regions 23 for fixing a P-well are connected. Through connection of the gate electrodes 1 to 6 and a second P+ region 24 for fixing a P-well via an electrode 20 connecting the second P+ region 24 for fixing a P-well and the gate electrodes, a parasitic resistance Rpw9 of the P-well 14 is added between the gate electrodes 1 to 6 and Vss. Rpw4 to Rpw9 are P-well parasitic resistances and the following relationship holds.

$$Rpw4 < Rpw5 < Rpw6 < Rpw7 < Rpw8 < Rpw9$$

A potential of the P-well 14 in the vicinity of the second P+ region 24 for fixing a P-well that rises the most when ESD current flows into the pad is thereby transmitted to the gate electrodes 1 to 6, and channel current flows between the N+ drains 12 and the N+ sources 11 of all the transistors. As a result, an effect of preventing current concentration is obtained.

CITATION LIST

Patent Literature

[PTL 1] JP 09-181195 A

SUMMARY OF INVENTION

Technical Problem

However, even in the invention disclosed in Patent Literature 1, complete current uniformity may not be obtained. Specifically, the same current does not flow through all the transistors, and current concentration cannot be completely eliminated. The reason is that a difference in potential rise of the P-well 14 immediately below the transistors that is a main cause of the current concentration is not eliminated. The potential rise of the gate electrodes 1 to 6 certainly causes channel current to flow through all the transistors. However, when, for example, the transistor having the gate electrode 1 and the transistor having the gate electrode 6 are compared to each other, the P-well potential of a channel portion of the transistor having the gate electrode 1 is more liable to rise than the P-well potential of a channel portion of the transistor having the gate electrode 6. Thus, due to a backgate effect, Vth of the transistor having the gate electrode 1 becomes lower than that of the transistor having the gate electrode 6, and the channel current flowing through the transistor having the gate electrode 1 becomes larger when a gate potential is the same. Further, parasitic bipolar current flows only through the transistor having the gate electrode 1. That is, the following relationship is obtained.

(current flowing through transistor having gate electrode 1)=(large channel current)+(parasitic bipolar current)

(current flowing through transistor having gate electrode 6)=(only small channel current)

The current-voltage characteristics are schematically shown in FIG. 9D. A curve 53 denotes current flowing through the transistor having the gate electrode 1, and a curve 54 denotes current flowing through the transistor having the gate electrode 6. At the time at which parasitic bipolar action of the transistor having the gate electrode 1 occurs, the channel current begins to flow through the transistor having the gate electrode 6, but the current is smaller than the current flowing through the transistor having the gate electrode 1.

Further, in the structure illustrated in FIG. 9, Rpw9 is large, and thus, parasitic bipolar action is more liable to occur than necessary. As a result, a hold voltage Vhold shown in FIG. 9D may extremely drop to become equal to or below a power supply voltage of an IC. When the pad electrode 18 is a power supply voltage pad and a relationship of (power supply voltage)>Vhold holds, if some noise above a trigger voltage Vtrig is injected from the power supply voltage pad when the power supply voltage is supplied, latch-up occurs between the power supply voltage pad and a Vss pad.

In a transistor illustrated in FIG. 10, the first P+ region 23 for fixing a P-well is further laid out so as to surround the transistors for the purpose of preventing latch-up operation of a circuit in the IC due to noise injected from a pad, when an ESD element is arranged in an IC.

A transistor on which current concentrates in this case is, similarly to the case illustrated in FIG. 9, the transistor having the gate electrode 1, and a distance to a P+ guard ring 14 from a center of the gate electrode 1 is larger than that from both ends of the gate electrode 1 in a gate width direction (direction perpendicular to a direction connecting an N+ source and an N+ drain). Thus, current concentrates on the vicinity of the center of the gate electrode 1 in the transistor having the gate electrode 1 to further lower the ESD tolerance. Consequently, not only a multi finger type ESD element in which a plurality of transistors are arranged as illustrated in FIG. 8 to FIG. 10 but also a single finger type ESD element including only one transistor cannot exploit performance of the ESD element due to current concentration that occurs therein.

From this, the structure of FIG. 9, which is the invention of Patent Literature 1, has the effect of improving the ESD tolerance compared with a related-art method illustrated in FIG. 8, but current is liable to concentrate on the transistor having the gate electrode 1. Thus, when this structure is used for the power supply voltage pad, there is a high probability that latch-up is induced. A structure in which latch-up strength is further enhanced results in further liability to current concentration, and the performance of the ESD element cannot be fully exploited.

Ideally, in order to cause uniform current to flow through all the transistors and all channels and to prevent Vhold from dropping too much, it is necessary to equally raise the potential of the P-well 14 immediately below all the transistors and channels to eliminate the underlying cause, and at the same time, to prevent an abrupt potential rise. In order to realize this, a technology illustrated in FIG. 11A to FIG. 11C is known. FIG. 11A is a plan view, FIG. 11B is a sectional view taken along the line C-C', and FIG. 11C is an equivalent circuit. This is a method in which second P+ regions 24 for fixing a P-well are formed adjacent to the N+ sources 11 of the transistors and are connected to the Vss electrode 17. Distances from all the respective transistors and all the respective channels to the second P+ regions 24 for fixing a P-well are the same. Thus, the parasitic P-well resistances added between the P-well immediately below all the channels and Vss are the same (Rpw10 in the equivalent circuit illustrated in FIG. 11C), and uniform current is caused to flow through all the transistors and all the channels. Further, Rpw10 is small and parasitic bipolar action is less liable to occur, and thus, there is a smaller probability that latch-up is induced. However, that has an adverse effect that a thermal breakdown is liable to occur, which is a drawback. The reason is as follows. FIG. 11D is for showing current-voltage characteristics of the structure illustrated in FIG. 11A to FIG. 11C. For the sake of easy comparison, the characteristics are overlaid on the characteristics shown in FIG. 8D. When the P-well potential immediately below the channels are less liable to rise and parasitic bipolar action is less liable to occur as in the case illustrated in FIG. 11A to FIG. 11C, both the trigger voltage Vtrig and the hold voltage Vhold rise and a distance between Vtrig and Vhold reduces as in the case of I-V characteristics 55 of the transistors having the gate electrodes 1 to 6 shown in FIG. 11D. The risk of inducing latch-up can be thereby avoided. However, since a heat quantity (current×voltage) during dissipation of static electricity is large, a thermal breakdown of the ESD element is liable to occur. The ESD tolerance becomes lower than that of the structure illustrated in FIG. 8 and the required characteristics cannot be obtained.

Solution to Problem

In order to solve the problem described above, the following configurations are employed.

According to one aspect of the present invention, there is provided a semiconductor device having an ESD element, the ESD element including:
 a semiconductor substrate;
 a P-well formed on a surface of the semiconductor substrate and having an impurity concentration that is higher than an impurity concentration of the semiconductor substrate;
 an N-type source and an N-type drain formed on the surface of the semiconductor substrate in the P-well and having an impurity concentration that is higher than the impurity concentration of the semiconductor substrate;
 a P-type region formed on the surface of the semiconductor substrate so as to be in contact with the N-type source and having an impurity concentration that is higher than the impurity concentration of the semiconductor substrate;
 a gate insulating film formed on the surface of the semiconductor substrate between the N-type source and the N-type drain; and
 a gate electrode formed on the gate insulating film, in which the N-type drain is connected to a pad electrode,
in which the N-type source is connected to a lower power supply potential, and
in which the N-type source and the P-type region are prevented from being connected to each other via an electrode.

According to another aspect of the present invention, in the semiconductor device having an ESD element, the P-type region includes a plurality of P-type regions, and the plurality of P-type regions are electrically connected to each other via a substance having a resistivity that is equal to or lower than a resistivity of the plurality of P-type regions.

According to another aspect of the present invention, in the semiconductor device having an ESD element, the gate electrode is electrically connected to the N-type source.

According to another aspect of the present invention, in the semiconductor device having an ESD element, the gate electrode is electrically connected to the P-type region.

Advantageous Effects of Invention

When the ESD element is operated, uniform current flows through channels of a plurality of transistors included in the ESD element. Thus, heat generation is suppressed, and performance of the ESD element can be fully exploited. As a result, an area of the ESD element can be reduced.

Further, depending on the structure, a withstand voltage can be easily adjusted.

BRIEF DESCRIPTION OF DRAWINGS

FIG. 1 are illustrations of Embodiment 1 of the present invention.

FIG. 2 are illustrations of Embodiment 2 of the present invention.

FIG. 3 are illustrations of Embodiment 3 of the present invention.

FIG. 4 are illustrations of Embodiment 4 of the present invention.

FIG. 5 are illustrations of Embodiment 5 of the present invention.

FIG. 6 are illustrations of Embodiment 6 of the present invention.

FIG. 7 are illustrations of Embodiment 7 of the present invention.

FIG. 8 are illustrations of a related-art ESD element.

FIG. 9 are illustrations of a related-art ESD element of Patent Literature 1.

FIG. 11 are illustrations of a related-art ESD element for the purpose of uniform current flowing through all transistors and all channels.

FIG. 12 are illustrations of Embodiment 8 of the present invention.

FIG. 13 are illustrations of Embodiment 9 of the present invention.

DESCRIPTION OF EMBODIMENTS

Now, embodiments of the present invention are described with reference to the drawings.

Embodiment 1

Figure 1A:
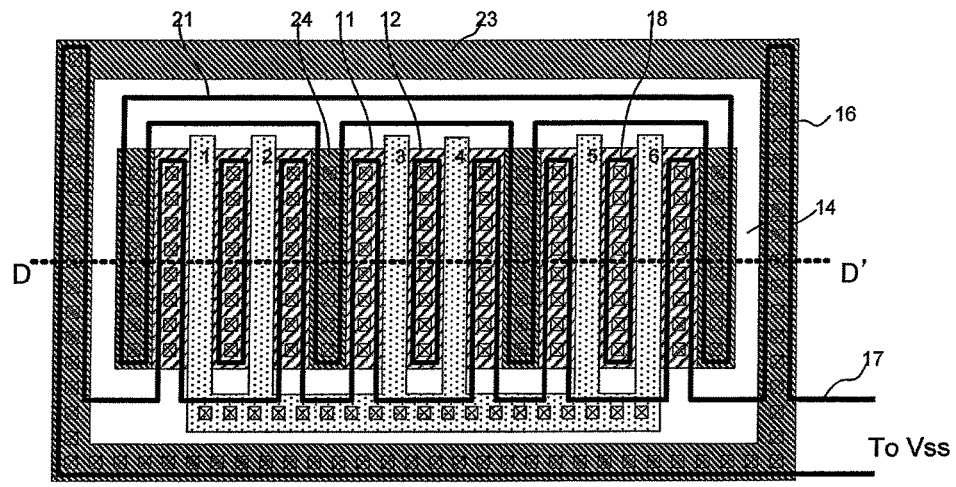
FIG. 1A is a plan view.
Figure 1B:
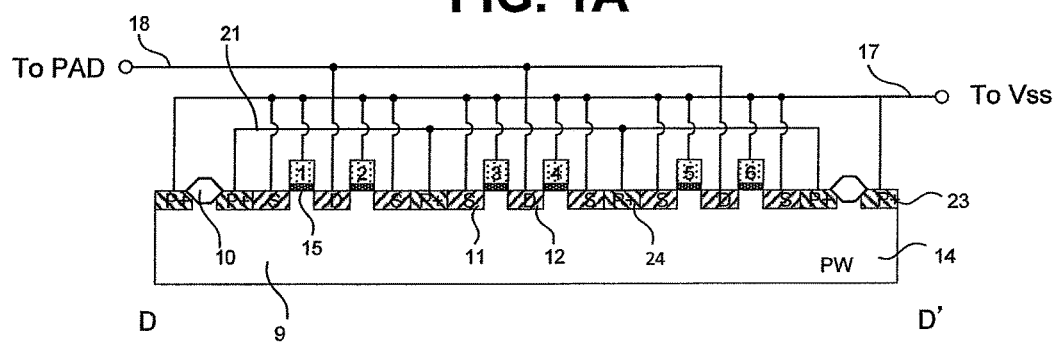
FIG. 1B is a sectional view taken along the line D-D'.

FIG. 1 are illustrations of an ESD element of Embodiment 1 of the present invention, and FIG. 1A is a plan view and FIG. 1B is a sectional view taken along the line D-D'. With reference to FIG. 1A, a pad electrode (or a drain electrode connected to the pad electrode) 18 is assumed to be not floating, but connected to a pad via an upper layer electrode.

NMOS transistors are in a P-well 14 formed in a semiconductor substrate 9. A first P+ region 23 for fixing a P-well for the purpose of fixing a potential is on a surface of the P-well 14 around the NMOS transistors, and is connected to wiring 17 having a Vss potential via contacts 16. Gate electrodes 1 to 6 and N+ sources 11 of the NMOS transistors are connected to a Vss terminal having a lower power supply potential via the wiring 17, and N+ drains 12 are connected to the pad electrode via wiring 18. Second P+ regions 24 for fixing a P-well are formed adjacent to and in contact with the N+ sources 11. A LOCOS oxide film 10 is arranged between an outermost second P+ region 24 for fixing a P-well and the first P+ region 23 for fixing a P-well. A gate insulating film 15 is arranged under each gate electrode. The indication of N+ or P+ is for showing not only a conductivity type of a semiconductor but is also for showing that an impurity concentration of a region indicated with N+ or P+ is higher than that of a region indicated with N or P and is a concentration with which an ohmic contact with metal wiring can be generally formed. A "heavily doped N-type drain" has the same meaning as an "N+ drain".

Figure 1C:
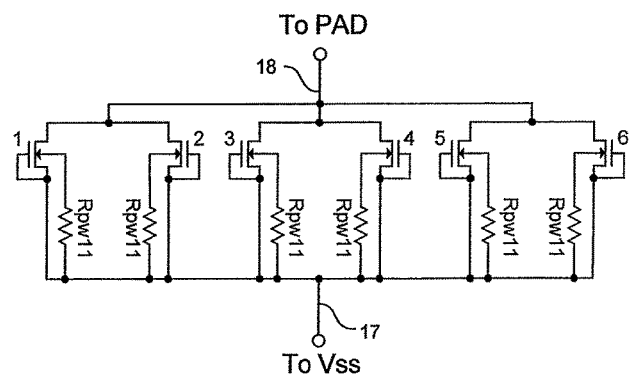
FIG. 1C is an equivalent circuit.
Figure 10:
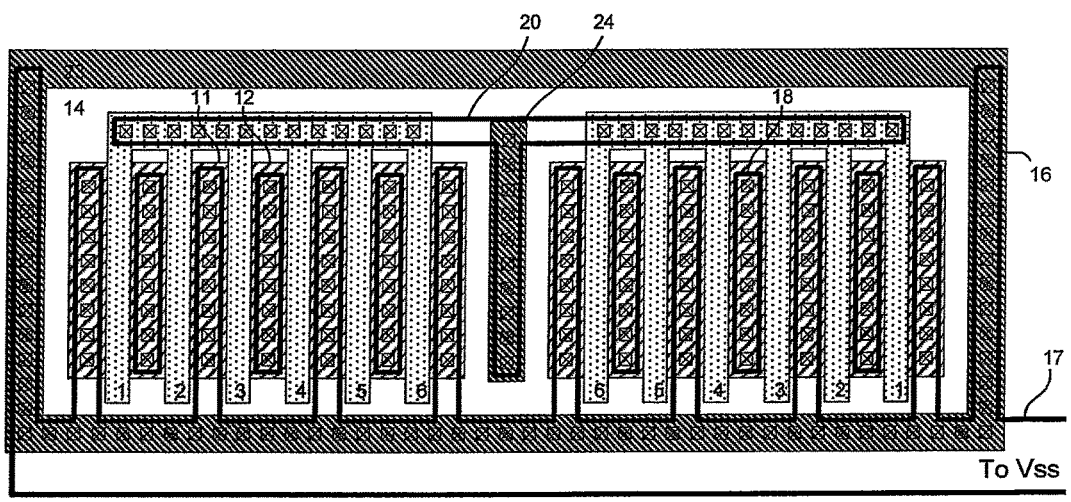
FIG. 10 is a plan view when a first P+ for fixing a P-well of the related-art ESD element of Patent Literature 1 is arranged so as to surround transistors.
Figure 11A:
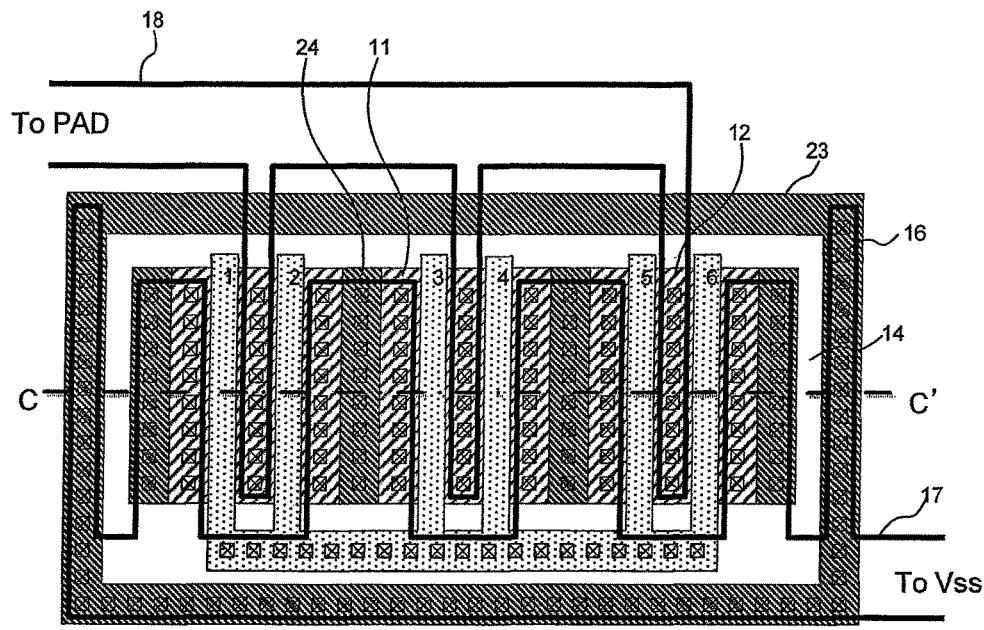
FIG. 11A is a plan view.
Figure 11B:
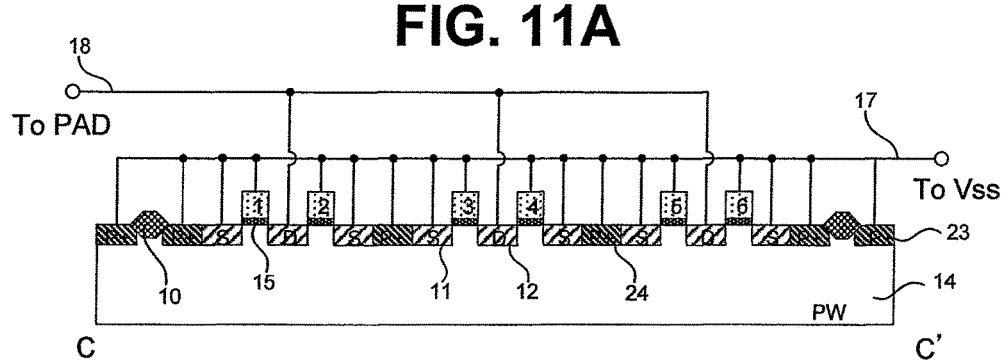
FIG. 11B is a sectional view taken along the line C-C'.
Figure 11C:
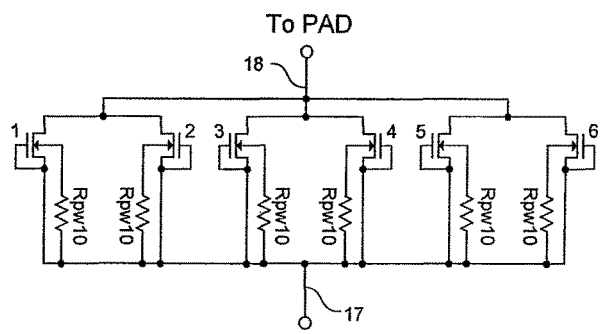
FIG. 11C is an equivalent circuit.
Figure 11D:
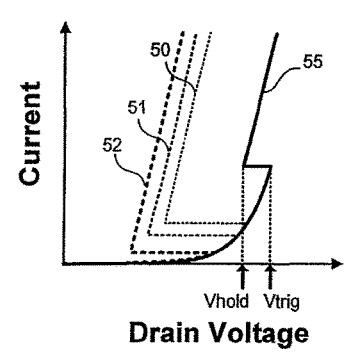
FIG. 11D is for showing current-voltage characteristics.

The structure illustrated in FIG. 1 is similar to the related-art ESD element illustrated in FIG. 10 in that all the second P+ regions 24 for fixing a P-well are connected via a second P+ electrode 21 for fixing a P-well, but has a feature in that the second P+ electrode 21 for fixing a P-well is not connected to a Vss electrode 17 having a lower power supply potential via a low resistance metal electrode. With this structure, parasitic resistances of the P-well 14 immediately below all the transistors and channels are the same Rpw11 as illustrated in FIG. 1C, and uniform current flows through all the transistors and channels. This effect is the same as that of the related art illustrated in FIG. 10, and thus, the problem of the structures illustrated in FIG. 8 and FIG. 9 can be avoided. In this case, the second P+ electrode 21 for fixing a P-well is required to be formed of a substance having a resistivity that is equal to or lower than that of the second P+ regions 24 for fixing a P-well, for example, metal. The reason is that, if the second P+ regions 24 for fixing a P-well are connected to each other via a high resistance substance, there is a potential difference among the second P+ regions 24 for fixing a P-well, and current concentration may occur.

Further, as can be seen from FIG. 1B, Rpw11 depends on a distance from transistors having gate electrodes 1 and 6 to the first P+ region 23 for fixing a P-well. Thus, a relationship of Rpw10<Rpw11 holds, and a breakdown due to heat generation that is a problem of the related art illustrated in FIG. 10 is less liable to occur.

Embodiment 2

Figure 2A:
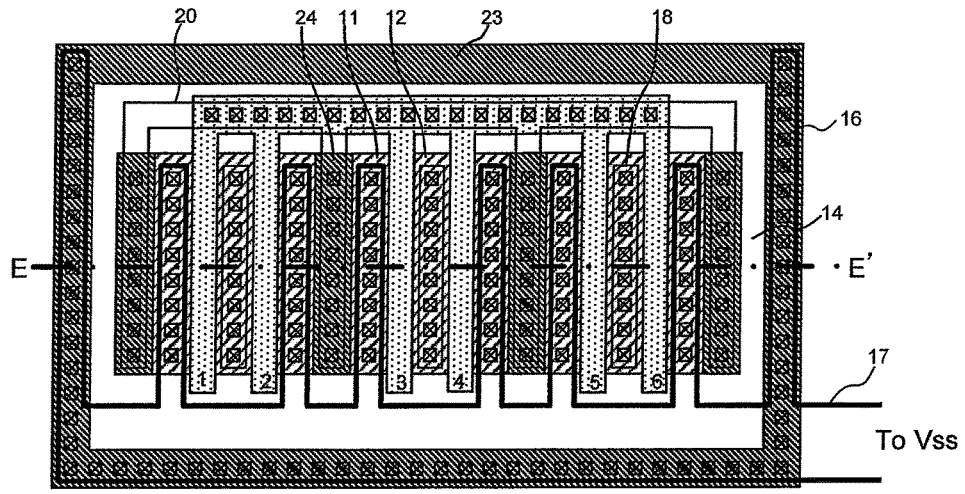
FIG. 2A is a plan view.
Figure 2B:
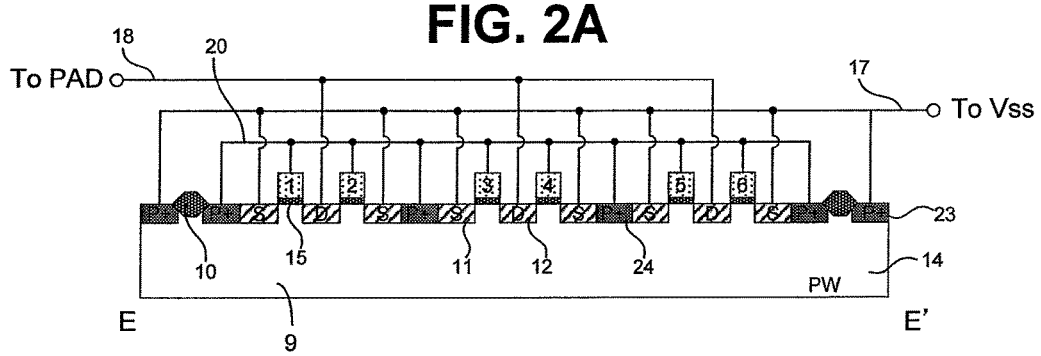
FIG. 2B is a sectional view taken along the line E-E'.
Figure 2C:
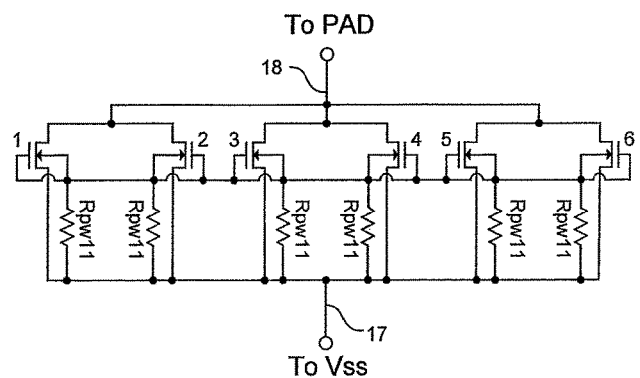
FIG. 2C is an equivalent circuit.

FIG. 2 are illustrations of Embodiment 2 of the present invention, and FIG. 2A is a plan view and FIG. 2B is a sectional view taken along the line E-E'. With reference to FIG. 2A, the pad electrode (or the drain electrode connected to the pad electrode) 18 is assumed to be not floating, but connected to the pad via the upper layer electrode. FIG. 2 are illustrations of an example in which the gate electrodes 1 to 6 of Embodiment 1 illustrated in FIG. 1 are not connected to the Vss electrode 17 but are connected to the second P+ regions 24 for fixing a P-well via an electrode 20 connecting the second P+ for fixing a P-well and the gate electrodes. This applies a potential to the gate electrodes 1 to 6 when static electricity injected from the pad electrode is dissipated, with the result that not only parasitic bipolar current but also channel current flows. Thus, in addition to the effect obtained by Embodiment 1, an ESD tolerance is improved compared with the case of Embodiment 1.

Embodiment 3

Figure 3A:
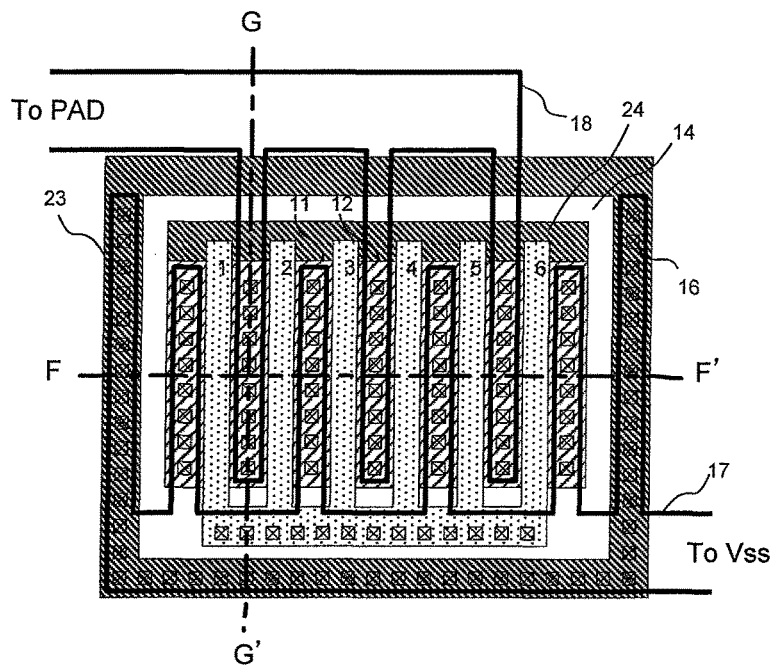
FIG. 3A is a plan view.
Figure 3B:
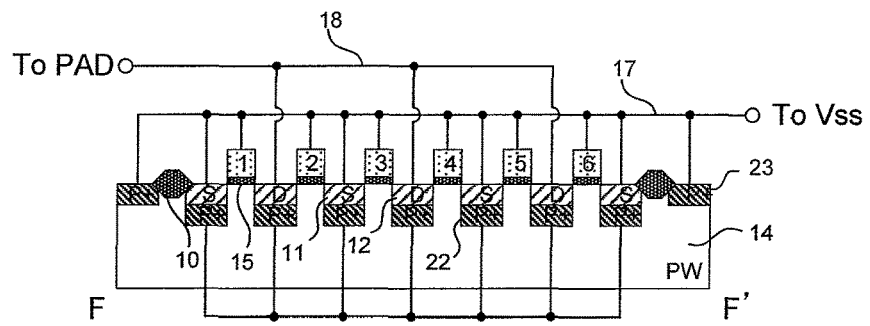
FIG. 3B is a sectional view taken along the line F-F'.
Figure 3C:
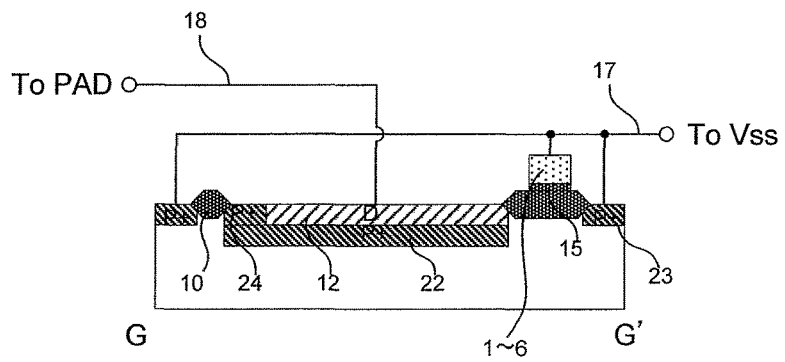
FIG. 3C is a sectional view taken along the line G-G'.

FIG. 3 are illustrations of Embodiment 3 of the present invention, and FIG. 3A is a plan view, FIG. 3B is a sectional view taken along the line F-F', and FIG. 3C is a sectional view taken along the line G-G'. This structure realizes the function of fixing potentials of regions immediately below the channels of the second P+ region 24 for fixing a P-well adjacent to the N+ sources 11 illustrated in FIG. 1 and FIG. 2, with embedded P+ regions 22 being heavily doped P-type regions that are embedded immediately below the N+ sources 11 and N+ drains 12 so as to be in contact therewith. As illustrated in FIG. 3B and FIG. 3C, the embedded P+ regions 22 immediately below the respective N+ sources 11 and N+ drains 12 are independent of one another, and thus, are electrically connected via the second P+ region 24 for fixing a P-well that lies on an upper side in FIG. 3A and the embedded P+ regions 22 immediately below the second P+ region 24 for fixing a P-well. The second P+ region 24 for fixing a P-well is not connected to the Vss electrode 17 having a lower power supply potential via a low resistance metal electrode. The equivalent circuit is consequently the same as that illustrated in FIG. 1C, and the same effect as that of Embodiment 1 can be obtained. Further, the second P+ regions 24 for fixing a P-well adjacent to the N+ sources 11 in Embodiment 1 are embedded in the semiconductor substrate as the embedded P+ regions 22, and thus, the area can be reduced compared with the case of Embodiment 1. Further, through adjustment of an impurity concentration and a depth of the embedded P+ regions 22 immediately below the N+ drains 12, Vhold and Vtrig can be easily adjusted, and thus Vtrig of the ESD element can be finely adjusted and prevented from being equal to or below a withstand voltage of the IC. Wiring and contacts on the N+ drains 12 are omitted in FIG. 3C.

Embodiment 4

Figure 4A:
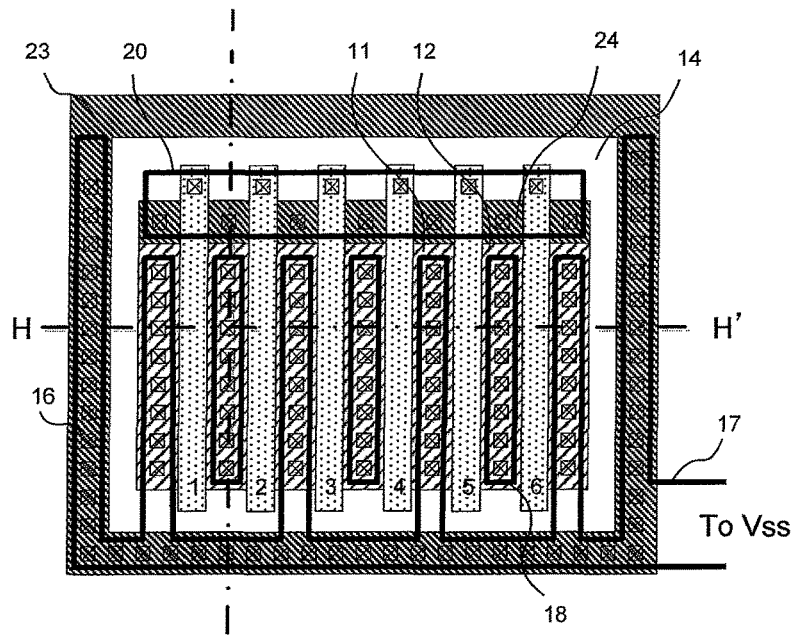
FIG. 4A is a plan view.
Figure 4B:
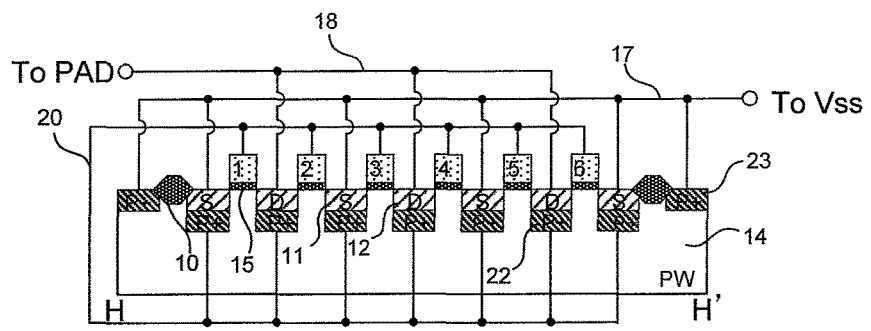
FIG. 4B is a sectional view taken along the line H-H'.
Figure 4C:
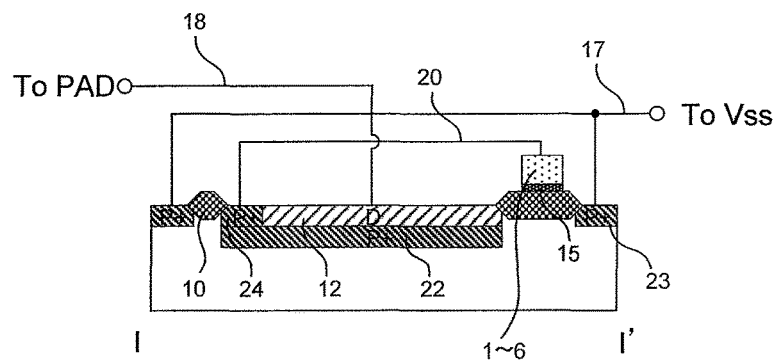
FIG. 4C is a sectional view taken along the line I-I'.

FIG. 4 are illustrations of Embodiment 4 of the present invention, FIG. 4A is a plan view and FIG. 4B is a sectional view taken along the line H-H', and FIG. 4C is a sectional view taken along the line I-I'. With reference to FIG. 4A, the pad electrode (or the drain electrode connected to the pad electrode) 18 is assumed to be not floating, but connected to the pad via the upper layer electrode. FIG. 4 are illustrations of an example in which the gate electrodes 1 to 6 of Embodiment 3 illustrated in FIG. 3 are not connected to the Vss electrode 17 but are connected to the second P+ regions 24 for fixing a P-well via the electrode 20 connecting the second P+ for fixing a P-well and the gate electrodes. This applies a potential to the gate electrodes 1 to 6 when static electricity injected from the pad electrode is dissipated, with the result that not only parasitic bipolar current but also channel current flows. Thus, in addition to the effect obtained by Embodiment 3, the ESD tolerance is improved compared with the case of Embodiment 3.

In this case, the electrode 20 connecting the second P+ for fixing a P-well and the gate electrodes is required to be formed of a substance having a resistivity that is equal to or lower than that of the second P+ regions 24 for fixing a P-well, for example, metal. The reason is that, if the second P+'s 24 for fixing a P-well are connected to each other via a high resistance substance, there is a potential difference among the second P+ regions 24 for fixing a P-well, and current concentration may occur.

Further, the same effect can be obtained even when the embedded P+ regions 22 immediately below the N+ sources 11 and the N+ drains 12 in Embodiments 3 and 4 are immediately below any one of the N+ sources 11 and the N+ drains 12. However, when the embedded P+ regions 22 are arranged immediately below only the N+ sources 11, Vhold and Vtrig cannot be adjusted using the impurity concentration and the depth of the embedded P+ regions 22.

Embodiment 5

Figure 5A:
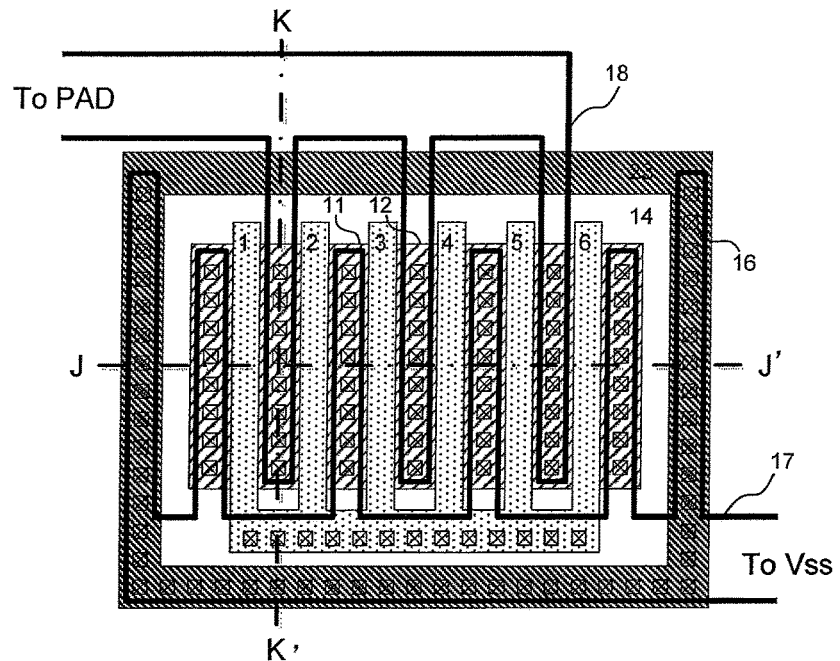
FIG. 5A is a plan view.
Figure 5B:
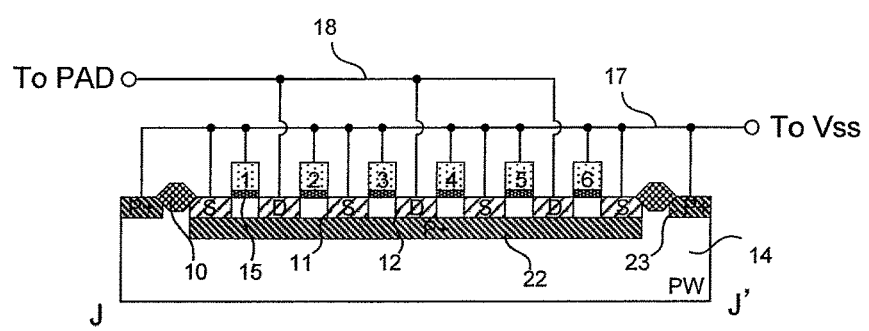
FIG. 5B is a sectional view taken along the line J-J'.
Figure 5C:
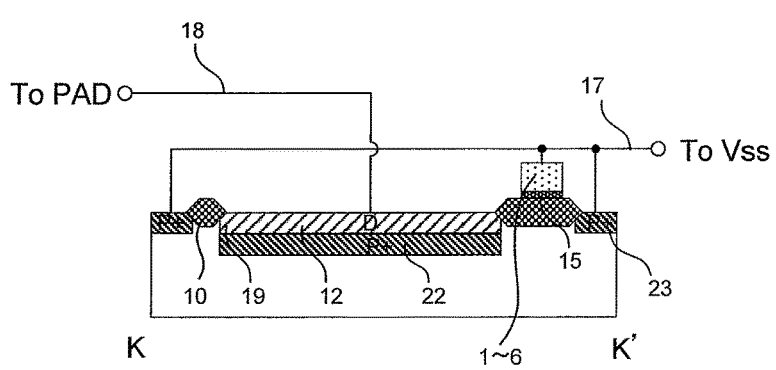
FIG. 5C is a sectional view taken along the line K-K'.

FIG. 5 are illustrations of Embodiment 5 of the present invention, and FIG. 5A is a plan view, FIG. 5B is a sectional view taken along the line J-J', and FIG. 5C is a sectional view taken along the line K-K'. In the plan view of FIG. 5A, the structure is substantially the same as that of the related art illustrated in FIG. 8, but, as can be seen from the sectional views of FIG. 5B and FIG. 5C, the embedded P+ region 22 exists. Embodiment 5 has a feature in that, differently from the embedded P+ regions 22 immediately below the N+ sources 11 and the N+ drains 12 in Embodiment 3 illustrated in FIG. 3 and Embodiment 4 illustrated in FIG. 4, the embedded P+ region 22 in contact with the N+ sources 11 and the N+ drains 12 exists on an entire surface immediately below the transistors. This structure can obtain the same effect as that of the structure illustrated in FIG. 3. Since the embedded P+ region 22 is not independent and it is not necessary to connect the embedded P+ regions 22 to each other in a different region as described in in the description of Embodiment 3 and Embodiment 4, there is an effect that the area can be further reduced compared with the structure illustrated in FIG. 3. In this embodiment, the embedded P+ region 22 does not have an outlet or the like formed therein, and thus, the embedded P+ region 22 is not connected to the Vss electrode 17 having a lower power supply potential via a low resistance metal electrode.

Embodiment 6

Figure 6A:
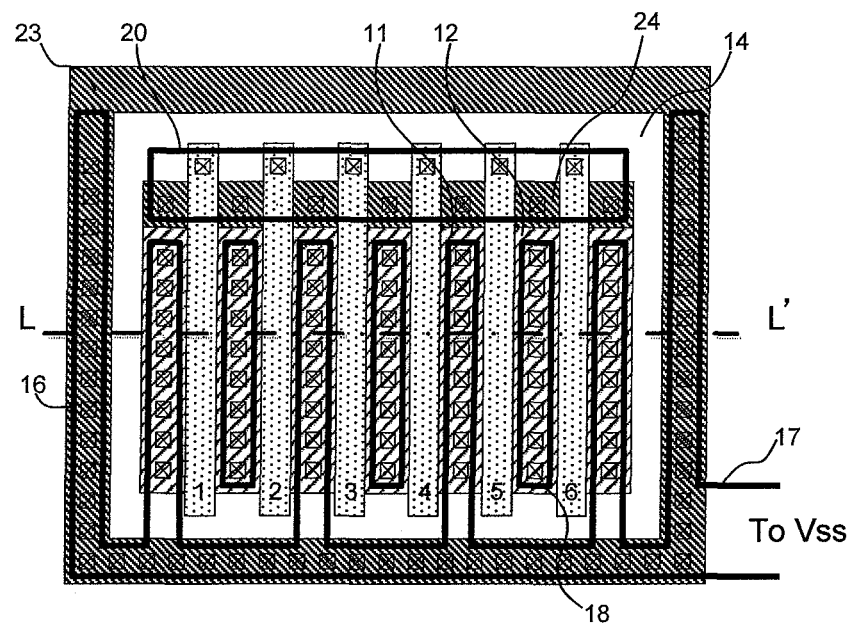
FIG. 6A is a plan view and FIG. 6B is a sectional view taken along the line L-L'.
Figure 6B:
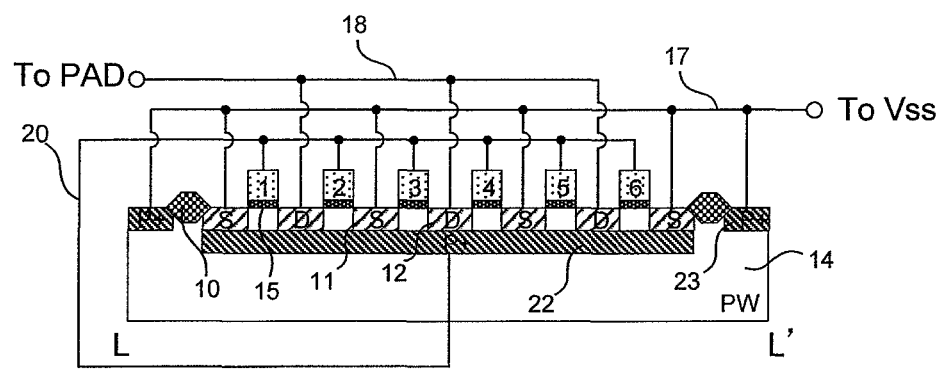

FIG. 6 are illustrations of Embodiment 6 of the present invention, and FIG. 6A is a plan view and FIG. 6B is a sectional view taken along the line L-L'. With reference to FIG. 6A, the pad electrode (or the drain electrode connected to the pad electrode) 18 is assumed to be not floating, but connected to the pad via the upper layer electrode. FIG. 6 are illustrations of a structure in which the second P+ regions 24 for fixing a P-well that lie on an upper side in FIG. 6A and the embedded P+ region 22 existing immediately therebelow are added to Embodiment 5 illustrated in FIG. 5. The gate electrodes 1 to 6 are not connected to the Vss electrode 17 but are connected to the second P+ regions 24 for fixing a P-well via the electrode 20 connecting the second P+ for fixing a P-well and the gate electrodes. This applies a potential to the gate electrodes 1 to 6 when static electricity injected from the pad electrode is dissipated, with the result that not only parasitic bipolar current but also channel current flows. Accordingly, the same effect as that of Embodiment 5 can be obtained. However, through addition of the second P+ regions 24 for fixing a P-well, the area is increased compared with the case of Embodiment 5.

In this case, the electrode 20 connecting the second P+ regions 24 for fixing a P-well and the gate electrodes is required to be formed of a substance having a resistivity that is equal to or lower than that of the second P+ regions 24 for fixing a P-well, for example, metal. The reason is that, if the second P+ regions 24 for fixing a P-well are connected to each other via a high resistance substance, there is a potential difference among the second P+ regions 24 for fixing a P-well, and current concentration may occur.

Embodiment 7

Figure 7A:
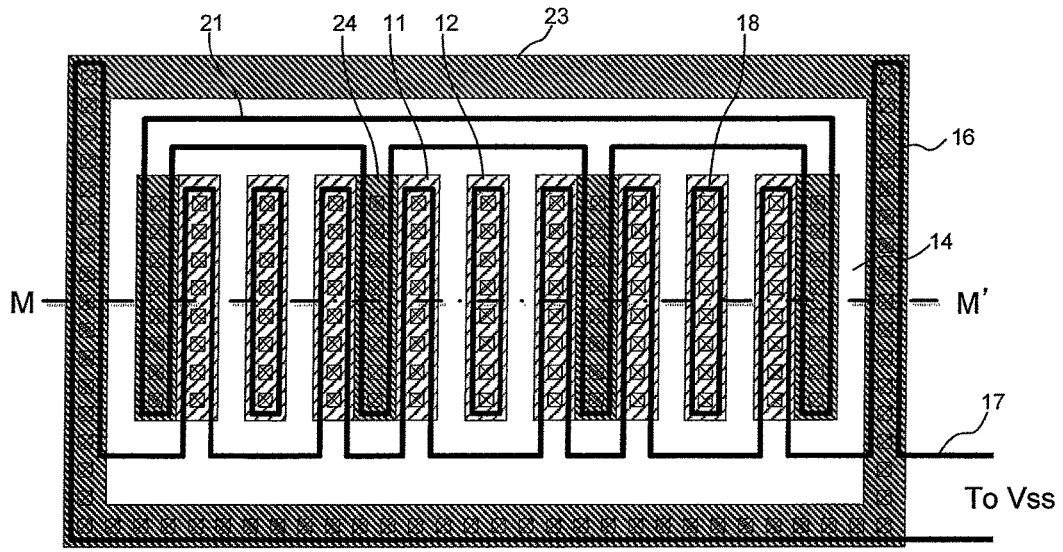
FIG. 7A is a plan view.
Figure 7B:
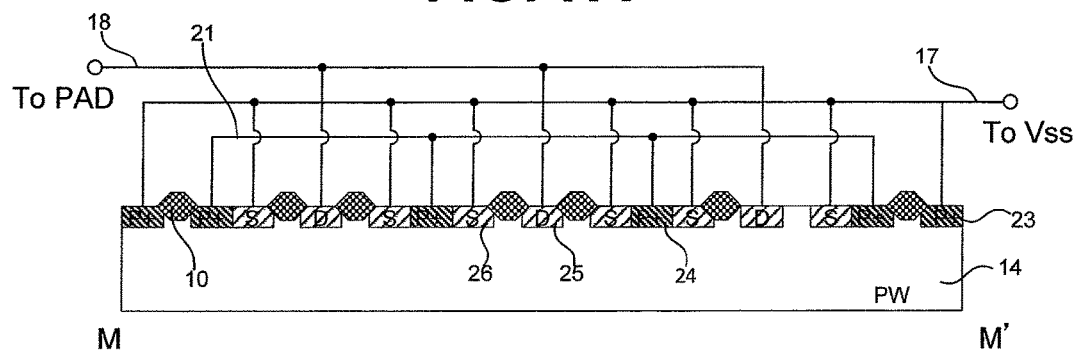
FIG. 7B is a sectional view taken along the line M-M'.
Figure 7C:
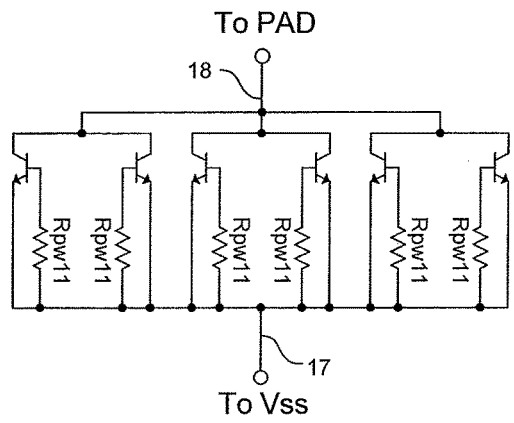
FIG. 7C is an equivalent circuit.
Figure 8A:
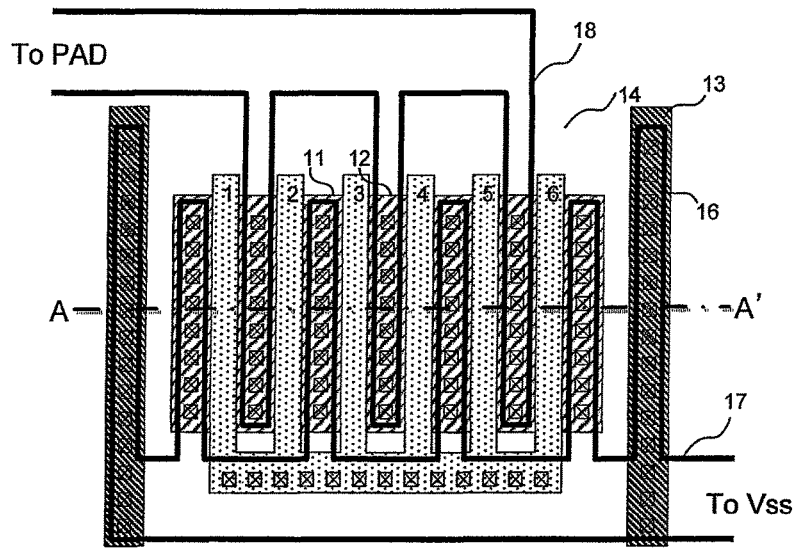
FIG. 8A is a plan view.
Figure 8B:
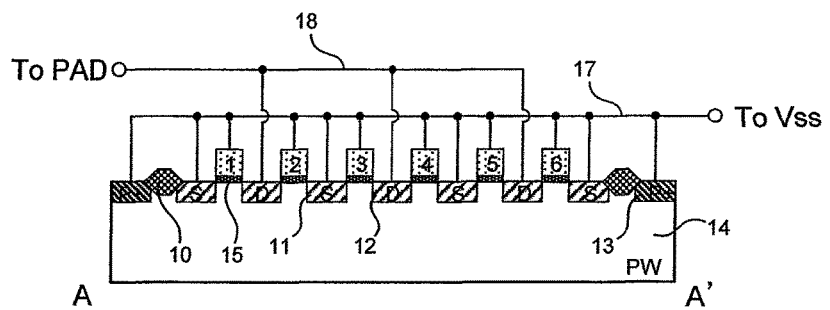
FIG. 8B is a sectional view taken along the line A-A'.
Figure 8C:
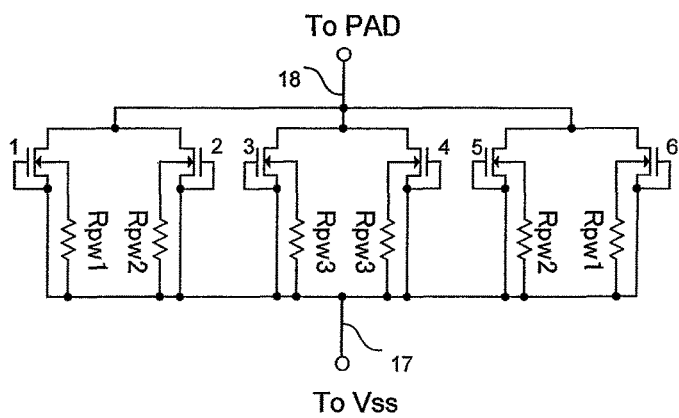
FIG. 8C is an equivalent circuit.
Figure 8D:
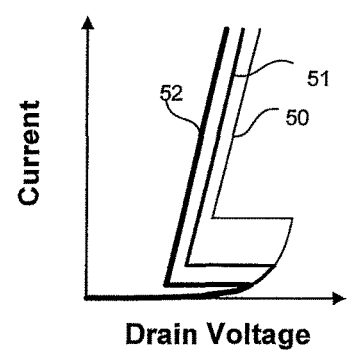
FIG. 8D is for showing current-voltage characteristics.
Figure 9A:
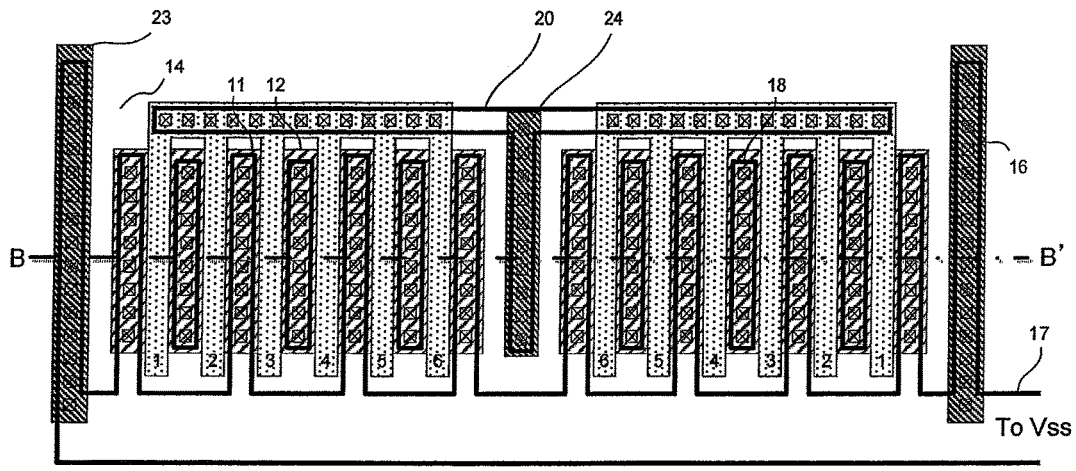
FIG. 9A is a plan view.
Figure 9B:
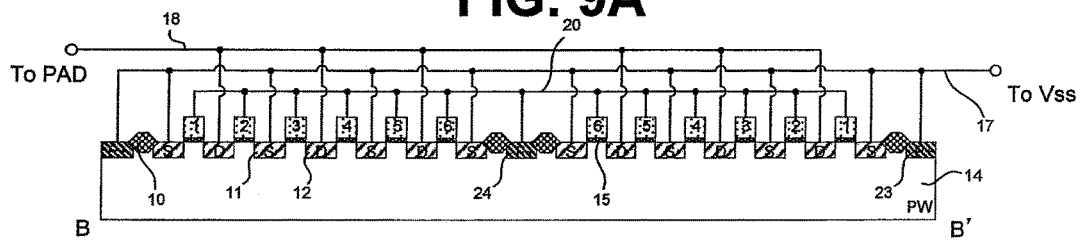
FIG. 9B is a sectional view taken along the line B-B'.
Figure 9C:
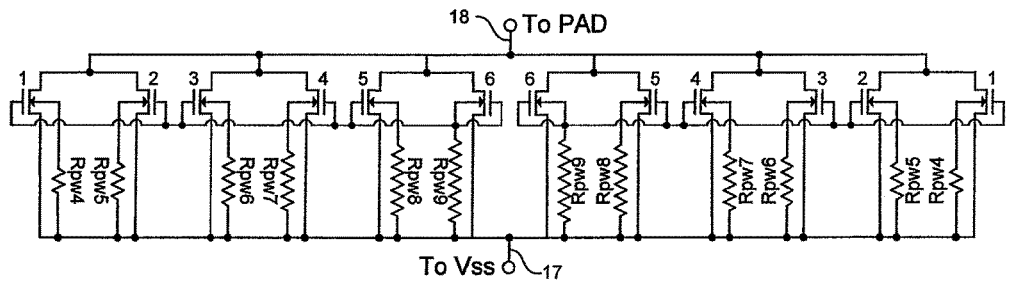
FIG. 9C is an equivalent circuit.
Figure 9D:
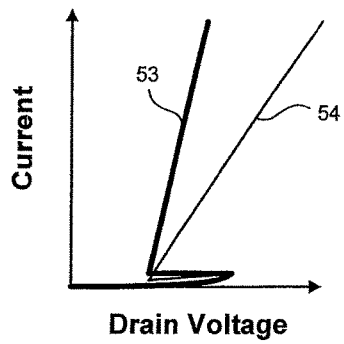
FIG. 9D is for showing current-voltage characteristics.

FIG. 7 are illustrations of an ESD element of Embodiment 7 of the present invention, and FIG. 7A is a plan view and FIG. 7B is a sectional view taken along the line M-M'. With reference to FIG. 7A, the pad electrode (or the drain electrode connected to the pad electrode) 18 is assumed to be not floating, but connected to the pad via the upper layer electrode. In this Embodiment 7, the MOS transistors in Embodiment 1 are changed to bipolar transistors, and an effect similar to that of Embodiment 1 can be obtained. In this case, the N+ sources 11 and the N+ drains 12 in FIG. 1 are N+ emitters 26 and N+ collectors 25, respectively, in FIG. 7, with the change from the MOS transistors to the bipolar transistors. Further, the second P+ regions 24 for fixing a P-well in FIG. 1 correspond to bases in FIG. 7, but, for the purpose of unifying terms, the word "base" is not used herein. Similarly to the case of Embodiment 1, the second P+ electrode 21 for fixing a P-well is not connected to the Vss electrode 17 having a lower power supply potential via a low resistance metal electrode.

This change from the MOS transistors to the bipolar transistors may be also applied to Embodiment 3 and Embodiment 5. Meanwhile, in Embodiment 2, Embodiment 4, and Embodiment 6, only the connection destinations of the gate electrodes in Embodiment 1, Embodiment 3, and Embodiment 5, respectively, are changed. Embodiment 1, Embodiment 3, and Embodiment 5 including the bipolar transistors having no gate electrodes instead of the MOS transistors and Embodiment 2, Embodiment 4, and Embodiment 6 including the bipolar transistors instead of the MOS transistors thereby have the same structure, respectively.

Embodiment 8

Figure 12A:
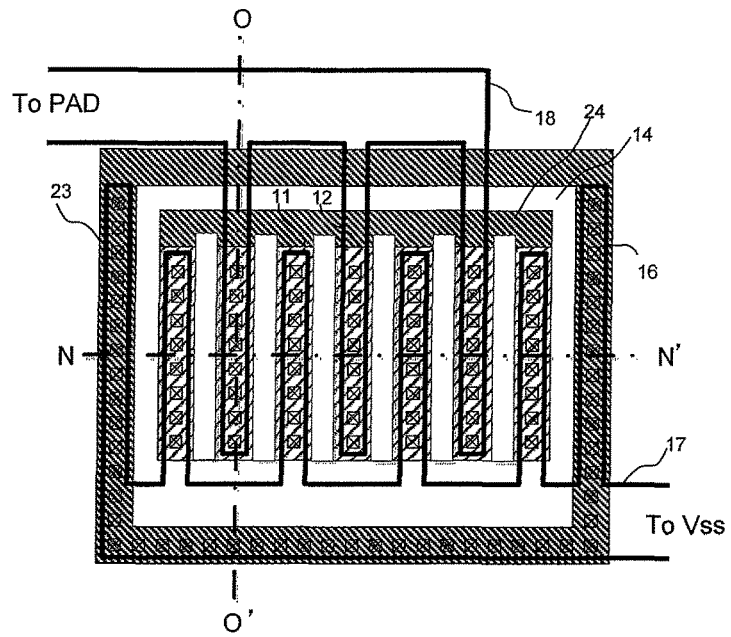
FIG. 12A is a plan view.
Figure 12B:
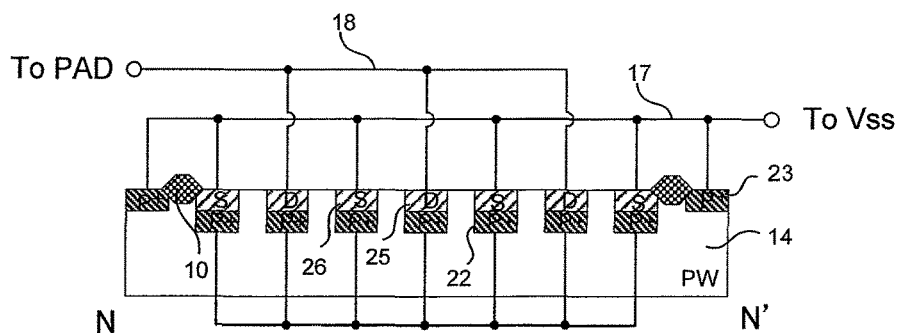
FIG. 12B is a sectional view taken along the line N-N'.
Figure 12C:
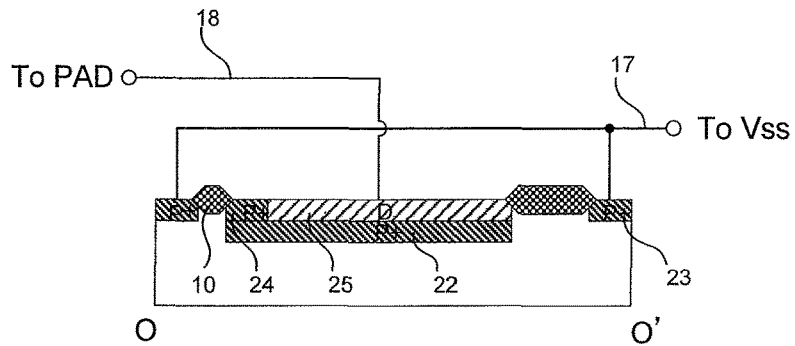
FIG. 12C is a sectional view taken along the line O-O'.

FIG. 12 are illustrations of an ESD protection element in which the MOS transistors in Embodiment 3 described above are changed to bipolar transistors. FIG. 12A is a plan view, FIG. 12B is a sectional view taken along the line N-N', and FIG. 12C is a sectional view taken along the line O-O'. Similarly to the case of Embodiment 7, the N+ collectors 25 and the N+ emitters 26 are formed, and the embedded P+ regions 22 are formed independently of one another under the N+ collectors 25 and the N+ emitters 26 so as to be in contact therewith, respectively. As can be seen from FIG. 12C, the embedded P+ regions 22 are electrically connected to each other via the second P+ region 24 for fixing a P-well and the embedded P+ regions 22 immediately below the second P+ region 24 for fixing a P-well. The second P+ region 24 for fixing a P-well is not connected to the Vss electrode 17 having a lower power supply potential via a low resistance metal electrode. This ESD protection element is configured to perform protection operation through bipolar operation.

Embodiment 9

Figure 13A:
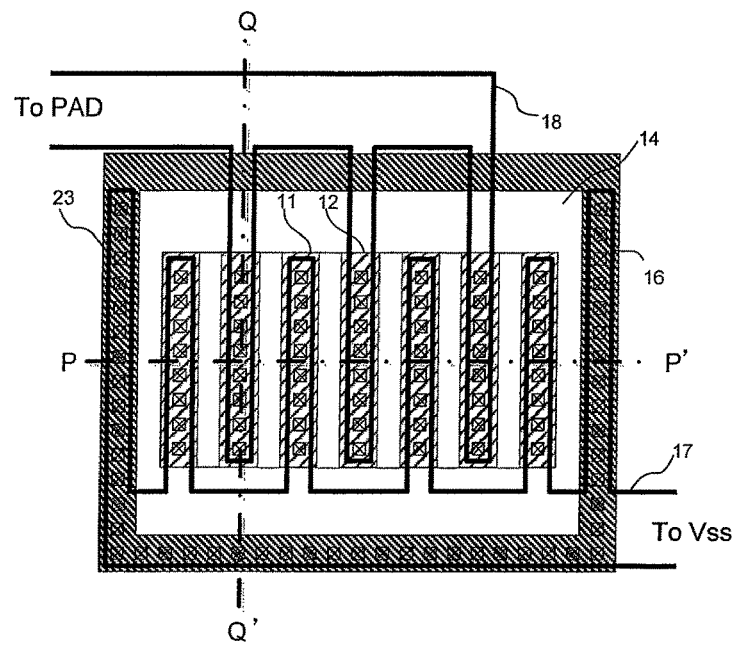
FIG. 13A is a plan view.
Figure 13B:
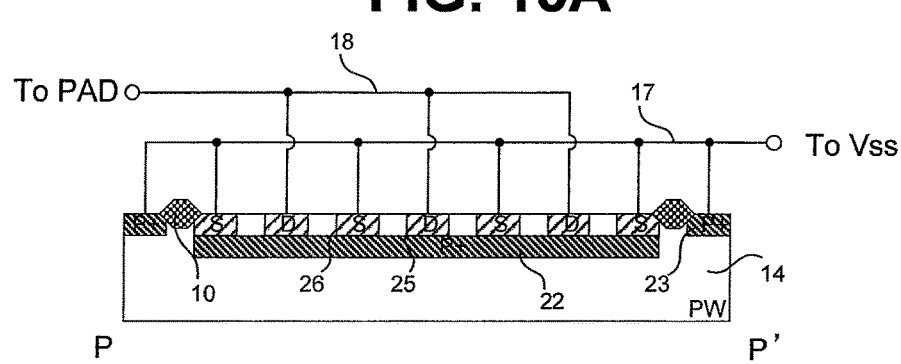
FIG. 13B is a sectional view taken along the line P-P'.
Figure 13C:
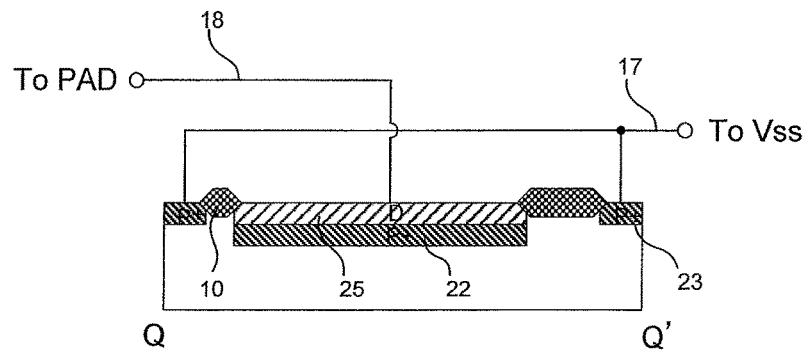
FIG. 13C is a sectional view taken along the line Q-Q'.

Similarly to the case of Embodiment 8, FIG. 13 are illustrations of an ESD protection element in which the MOS transistors in Embodiment 5 are changed to bipolar transistors. FIG. 13A is a plan view, FIG. 13B is a sectional view taken along the line P-P', and FIG. 13C is a sectional view taken along the line Q-Q'. Similarly to the case of Embodiment 8, the N+ collectors 25 and the N+ emitters 26 are formed, and the embedded P+ regions 22, which are integral, are continuously formed under the N+ collectors 25 and the N+ emitters 26 so as to be in contact therewith, respectively. As can be seen from FIG. 13C, in this embodiment, the embedded P+ regions 22 do not have an outlet or the like formed therein, and thus, the embedded P+ regions 22 are not connected to the Vss electrode 17 having a lower power supply potential via a low resistance metal electrode. This ESD protection element is configured to perform protection operation through bipolar operation.

As described above, an essence common in the present invention is that, by electrically connecting, via a low resistance substance, various substrate potentials existing in the respective transistors and in the respective channels of the ESD element, and further, separating the connection from the Vss potential, uniformization of current and suppression of heat generation through low voltage operation are attained to improve the ESD tolerance. This can be applied not only to the MOS type ESD element with the gate electrodes described above but also bipolar type ESD elements without the gate electrodes.

Further, multi finger type ESD elements are described above, but the present invention can be applied also to single finger type ESD elements, and the same effect can be obtained.

Further, as a matter of course, it is assumed that the present invention is implemented on a semiconductor substrate. Throughout the embodiments, impurity concentrations of the N+ sources 11, the N+ drains, the P+ region for fixing a P-well, the embedded P+ region, the first P+ region for fixing a P-well, the second P+ region for fixing a P-well are higher than that of the P-well 14, and the impurity concentration of the P-well 14 is higher than that of the semiconductor substrate.

REFERENCE SIGNS LIST

1-6 gate electrode
9 semiconductor substrate
10 LOCOS oxide film
11 N+ source
12 N+ drain
13 P+ region for fixing a P-well potential
14 P-well
15 gate insulating film
16 contact
17 Vss electrode
18 pad electrode
20 electrode connecting a second P+ region for fixing a P-well and a gate electrode
21 second P+ electrode for fixing a P-well
22 embedded P+ region
23 first P+ region for fixing a P-well
24 second P+ region for fixing a P-well
25 N+ collector
26 N+ emitter
50 I-V characteristic for transistors having gate electrodes 1 and 6 in FIG. 8
51 I-V characteristic for transistors having gate electrodes 2 and 5 in FIG. 8
52 I-V characteristic for transistors having gate electrodes 3 and 4 in FIG. 8
53 I-V characteristic for a transistor having a gate electrode 1 in FIG. 9
54 I-V characteristic for a transistor having a gate electrode 6 in FIG. 9
55 I-V characteristic for transistors having gate electrodes 1 to 6 in FIG. 10

The invention claimed is:

1. A semiconductor device having an ESD element, the ESD element comprising:
   a semiconductor substrate;
   a P-well formed on a surface of the semiconductor substrate;
   an N-type source and an N-type drain formed on the surface of the semiconductor substrate in the P-well and having an impurity concentration that is higher than the impurity concentration of the semiconductor substrate;
   a first P-type region formed on the surface of the semiconductor substrate apart from the N-type source and having an impurity concentration that is higher than the impurity concentration of the semiconductor substrate;
   a second P-type region formed on the surface of the semiconductor substrate so as to be in direct contact with the N-type source and apart from the first P-type region and having an impurity concentration that is higher than the impurity concentration of the semiconductor substrate;
   a gate insulating film formed on the surface of the semiconductor substrate between the N-type source and the N-type drain; and
   a gate electrode formed on the gate insulating film,
   the N-type drain being connected to a pad electrode,
   the N-type source and the first P-type region being connected to a lower power supply potential,
   the N-type drain is apart from a region of P-type having an impurity concentration higher than the impurity concentration of the semiconductor substrate,
   the first P-type region and the second P-type region being electrically connected to each other via the P-well and being not connected to each other via an electrode,
   the N-type source and the second P-type region being connected via the first P-type region and being not connected to each other via an electrode, and
   the second P-type region comprising a plurality of P-type regions, and the plurality of P-type regions being electrically connected to each other via a substance having a resistivity that is lower than a resistance value of the second P-type region.

2. A semiconductor device having an ESD element according to claim 1, wherein the gate electrode is electrically connected to the N-type source.

3. A semiconductor device having an ESD element according to claim 1, wherein the gate electrode is electrically connected to the second P-type region.

4. A semiconductor device having an ESD element according to claim 1, wherein the substance that electrically connects the plurality of P-type regions to each other is a metal.

* * * * *